(12) United States Patent
Saggio et al.

(10) Patent No.: US 7,498,619 B2
(45) Date of Patent: Mar. 3, 2009

(54) POWER ELECTRONIC DEVICE OF MULTI-DRAIN TYPE INTEGRATED ON A SEMICONDUCTOR SUBSTRATE AND RELATIVE MANUFACTURING PROCESS

(75) Inventors: Mario G. Saggio, Acicastello (IT); Ferruccio Frisina, Sant' Agata Li Battiati (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 267 days.

(21) Appl. No.: 11/362,435

(22) Filed: Feb. 23, 2006

(65) Prior Publication Data

US 2006/0194391 A1 Aug. 31, 2006

(30) Foreign Application Priority Data

Feb. 25, 2005 (EP) .................................. 05425102

(51) Int. Cl.
*H01L 21/332* (2006.01)

(52) U.S. Cl. ...................... 257/197; 257/328; 257/273; 257/341; 257/E21.417; 257/E29.256; 257/E21.383; 438/138; 438/135

(58) Field of Classification Search ................. 257/197, 257/E21.418, E29.04, 328, 191, 192, 341, 257/E21.383, E21.417, E29.256; 438/135, 438/137, 138

See application file for complete search history.

(56) References Cited

U.S. PATENT DOCUMENTS

| | | | |
|---|---|---|---|
| 5,216,275 A | 6/1993 | Chen | |
| 6,586,798 B1 * | 7/2003 | Frisina | 257/328 |
| 2001/0041400 A1 * | 11/2001 | Ren et al. | 438/200 |
| 2001/0053589 A1 * | 12/2001 | Frisina | 438/546 |
| 2002/0008258 A1 * | 1/2002 | Baba | 257/273 |
| 2002/0014671 A1 * | 2/2002 | Saggio et al. | 257/401 |
| 2002/0088990 A1 | 7/2002 | Iwamoto et al. | |
| 2004/0108568 A1 * | 6/2004 | Qu | 257/500 |
| 2005/0082570 A1 * | 4/2005 | Sridevan | 257/197 |
| 2006/0022292 A1 * | 2/2006 | Shenoy | 257/472 |

(Continued)

FOREIGN PATENT DOCUMENTS

DE    100 24 480 A1    11/2001

(Continued)

OTHER PUBLICATIONS

European Search Report, EP 05 42 5102, dated Sep. 15, 2005.

*Primary Examiner*—Zandra Smith
*Assistant Examiner*—Latanya Crawford
(74) *Attorney, Agent, or Firm*—Gardere Wynne Sewell LLP (57) ABSTRACT

A power electronic device is integrated on a semiconductor substrate of a first type of conductivity. The device includes a plurality of elemental units, and each elemental unit includes a body region of a second type of conductivity which is realized on a semiconductor layer of the first type of conductivity formed on the semiconductor substrate, and a column region of the first type of conductivity which is realized in said semiconductor layer below the body region. The semiconductor layer includes multiple semiconductor layers which overlap each other. The resistivity of each layer is different from that of the other layers. The column region includes a plurality of doped sub-regions, each realized in one of the semiconductor layers. The amount of charge of each doped sub-region balances the amount of charge of the corresponding semiconductor layer in which each doped sub-region is realized.

11 Claims, 6 Drawing Sheets

U.S. PATENT DOCUMENTS

2006/0145290 A1* 7/2006 Okumura et al. ............ 257/529
2006/0194391 A1* 8/2006 Saggio et al. ............... 438/268

FOREIGN PATENT DOCUMENTS

| DE | 102 45 049 | A1 | | 4/2004 |
| DE | 103 46 838 | A1 | | 5/2004 |
| DE | 102 45 049 | A1 | * | 8/2004 |
| EP | 1276156 | A1 | * | 1/2003 |

* cited by examiner

POWER ELECTRONIC DEVICE OF MULTI-DRAIN TYPE INTEGRATED ON A SEMICONDUCTOR SUBSTRATE AND RELATIVE MANUFACTURING PROCESS

PRIORITY CLAIM

The present application claims priority from European Patent Application No. 05425102.0 filed Feb. 25, 2005, the disclosure of which is hereby incorporated by reference.

BACKGROUND OF THE INVENTION

1. Technical Field of the Invention

The present invention relates to a power electronic device integrated on a semiconductor substrate and relative manufacturing process.

The present invention particularly, but not exclusively, relates to a power MOSFET device of the multi-drain type, and the following description is made with reference to this field of application for convenience of illustration only.

2. Description of Related Art

As is well known, power MOS devices with a breakdown voltage between 200 and 1000V have a high "on" resistance due mainly to the epitaxial drain layer resistance which is necessary to sustain high voltages. This high "on" resistance further depends on the dopant concentration of the epitaxial layer itself.

However, it is possible to obtain power MOS devices with a low "on" resistance and a high breakdown voltage BV by modifying the epitaxial layer concentration.

Figure 1:
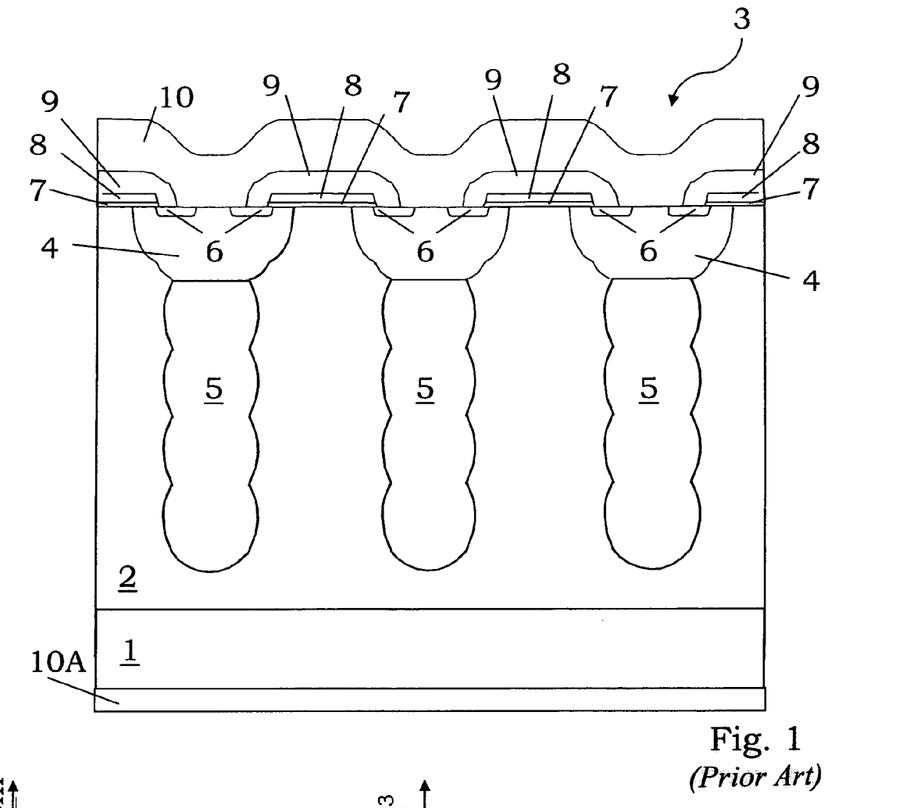
FIG. 1 is a sectional view of a multi-drain MOS power transistor of the known type.

A known device of the MOS type which meets this need is shown in FIG. 1. Such a power MOS device 3 of the multi-drain type comprises a highly doped semiconductor substrate 1 of the N+ type, whereon a semiconductor epitaxial layer 2 is formed of the same N type.

The epitaxial layer 2 forms a common drain layer for a plurality of elemental units which form the power MOS device 3. Each elemental unit comprises a body region 4 of the P type realized on the epitaxial layer 2.

In the epitaxial layer 2, below each body region 4, a column region 5 of the P type is present extending downwards for the whole thickness of the epitaxial layer 2 towards the semiconductor substrate 1.

In particular, each column region 5 is aligned and in contact with respective body region 4.

Figure 2:
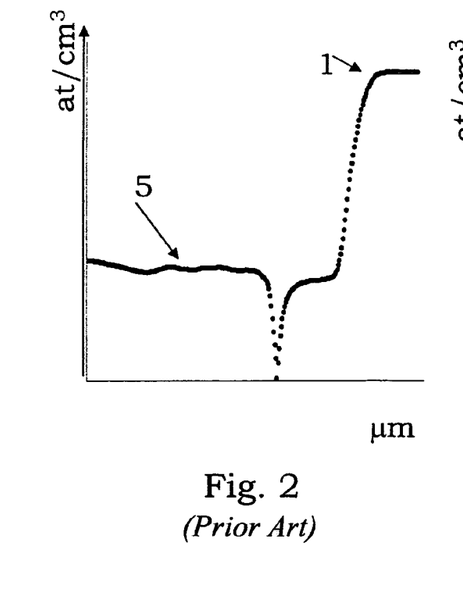
FIGS. 2 and 3 respectively show a concentration profile of the N drain epitaxial layer and of the column region P for the multi-drain MOS power transistor of FIG. 1.
Figure 3:
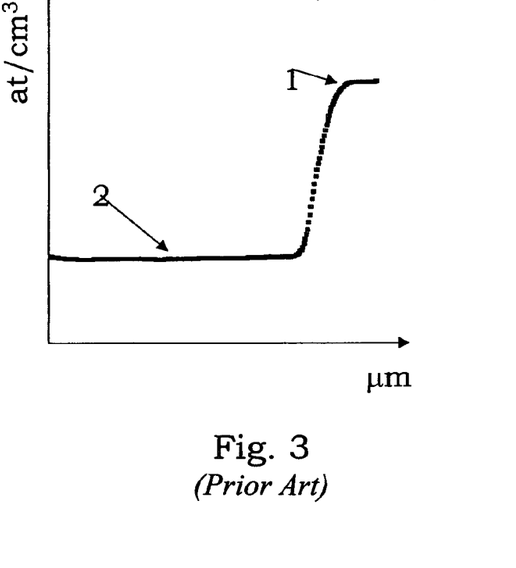

In this power MOS device 3 of the known type, as shown in FIG. 2 wherein the concentration of the epitaxial layer 2 is shown as function of its thickness, the epitaxial layer 2 of the N type has a constant resistivity. Also the column regions 5 have a constant concentration along the whole development of the column as shown in FIG. 3 wherein the concentration of the column regions 5 is shown as a function of their thickness.

The power MOS device 3 also has, inside the body regions 4, highly doped source regions 6 of the N type.

The surface of the epitaxial layer 2 is thus covered with a thin gate oxide layer 7 and with a polysilicon layer 8. Openings are thus provided in the polysilicon layer 8 and in the thin gate oxide layer 7 to expose the surface of the epitaxial layer 2 in correspondence with each source region 6. An insulating layer 9 covers completely the polysilicon layer 8 and partially the source regions 6, so as to allow a source metallic layer 10 to contact the source regions 6 and the body regions 4. A drain metallic layer 10A is also provided on the semiconductor substrate 1 lower surface 1.

Thus, the presence of the column regions 5 allows to reduce the resistivity of the epitaxial layer 2 without decreasing the breakdown voltage BV of the device 3. With this kind of device 3 it is thus possible to reach a predetermined voltage BV which has a resistivity of the epitaxial layer 2 lower than that necessary with conventional devices.

Although advantageous is several respects, this device has some drawbacks.

Figure 4A:
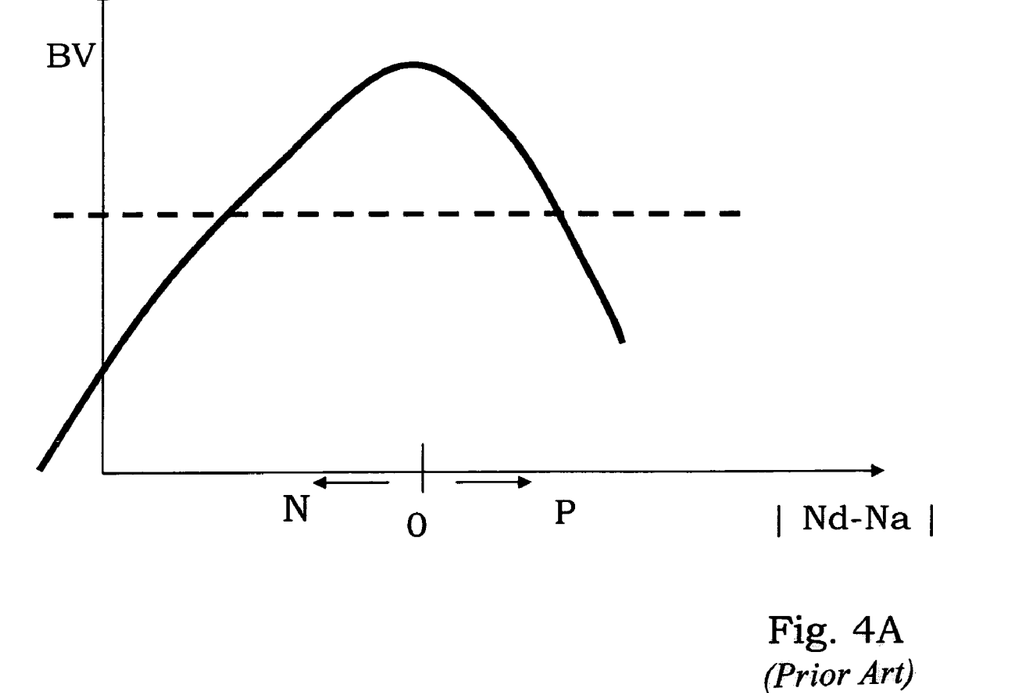
FIG. 4A shows the trend of the breakdown voltage BV when the charge balance conditions in the drain in known multi-drain power MOS devices varies.

In fact, as shown in FIG. 4A, the breakdown voltage BV varies when the concentration of the dopant of the P type in the epitaxial drain layer increases: in particular, the voltage BV is highest when the dopant concentration of the epitaxial drain layer is completely balanced by an implant dose $\Phi_E$ used to realize the column regions 5. In other words, the introduced dopant in the column regions has to over compensate for the dopant in the epitaxial drain layer in order to form a P region from N layer and this over compensation is performed so that the number of dopant atoms of P type (that exceed the compensation) are equal to the number of dopant atoms of N type of the external region to the column 5. This condition is indicated as "charge balance".

If the implant dose $\Phi$ used to realize the column regions 5 is lower than the implant dose $\Phi_E$, the concentration of the column regions 5 is lower than the concentration of the column regions 5 obtained in the case of "charge balance". This condition is indicated as "P charge defect" or, in the same way, "N charge excess". If instead the implant dose $\Phi$ used to realize the column regions 5 is higher than the implant dose $\Phi_E$, the concentration of the column regions 5 is higher than the concentration of the column regions 5 used in the case of "charge balance". This condition is indicated as "P charge excess" or, in the same way, "N charge defect".

As it has been said, under both these conditions the breakdown voltage BV of the obtained devices is lower than that which is obtained by using the implant dose $\Phi_E$.

Figure 4B:
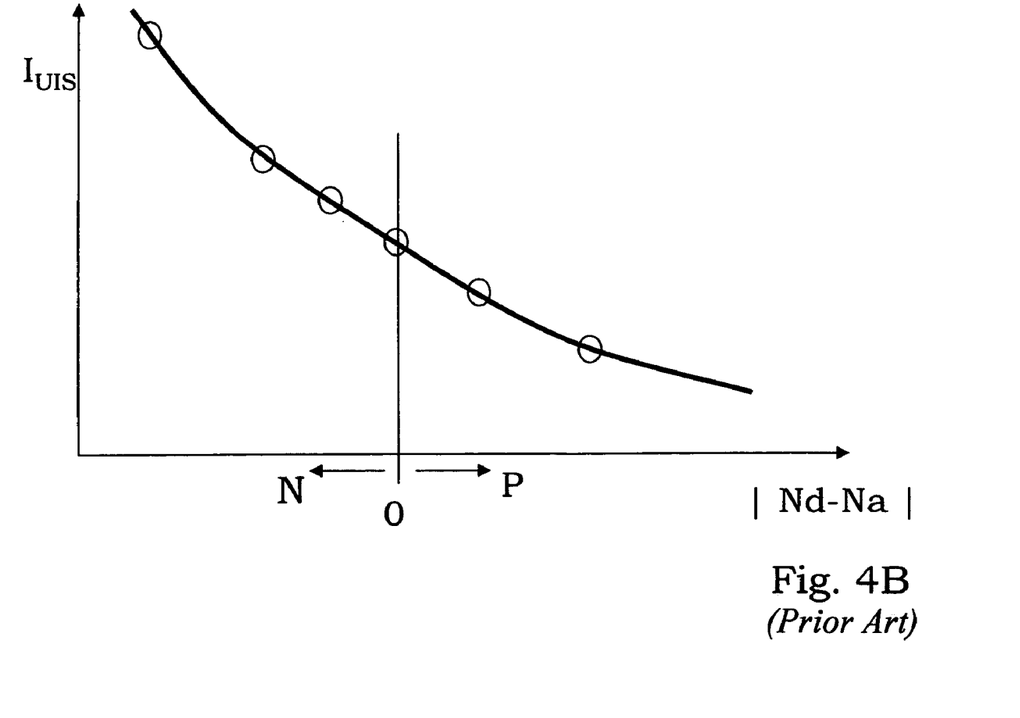
FIG. 4B shows the trend of the avalanche current when the charge balance conditions in the drain in known multi-drain power MOS devices varies.

However, as shown in FIG. 4B, when the concentration of the dopant of the P type in the column regions 5 increases, the avalanche current value $I_{UIS}$ decreases, i.e., the maximum current the device 3 can switch in an unclamped switch.

For this reason, currently used devices are realized so as to sustain a voltage BV lower than the maximum one which can be obtained, so that an avalanche current $I_{UIS}$ can be available being higher than the one which can be obtained when, in the epitaxial drain layer, there is charge balance, i.e., between the dopant concentration of the P type and of the N type.

Tests carried out by the Applicant have highlighted that the decrease of the avalanche current value $I_{UIS}$ when the concentration of the P dopant in the column regions 5 increases is caused by the increase of the electric field on the bottom of the column regions 5.

Figure 4C:
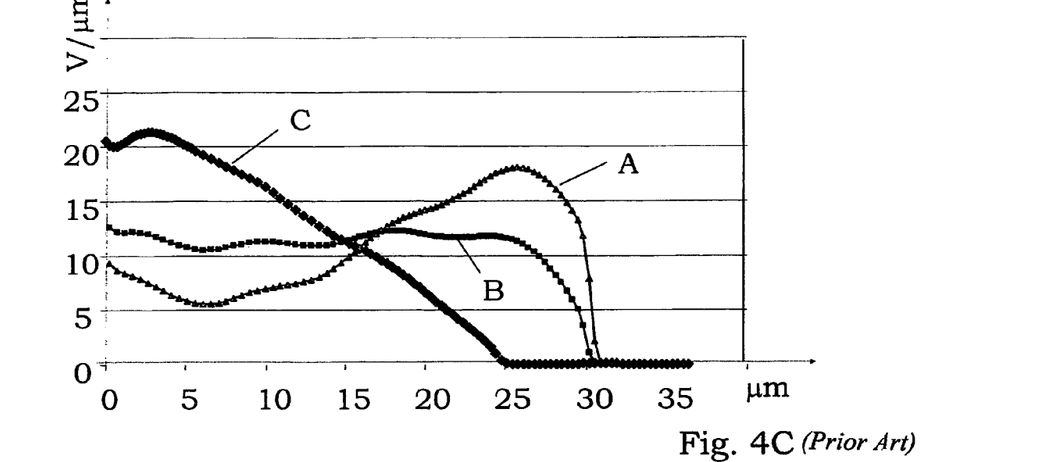
FIG. 4C shows three profiles of electric field inside the column regions 5 in the known multi-drain power device when charge balance condition in the drain with fixed voltage, for example equal to 60% of the breakdown voltage BV peak value varies.

In particular, such increase of the value of the electric field on the bottom of the column regions 5 is evident from the diagrams of FIG. 4C, wherein the curve A shows the trend of the electric field value inside the column regions 5 under "P charge excess" conditions, the curve B shows the trend of the electric field value inside the column regions 5 under "charge balance" condition, whereas the curve C shows the trend of the electric field value inside the column regions 5 under "N charge excess" conditions.

The technical problem underlying the present invention is that of forming a multi-drain device which, under charge balance conditions, has the highest breakdown voltage BV, thus overcoming the limits still affecting the devices realized according to the prior art. Advantageously, the value of the electric field on the bottom of the column regions is remarkably reduced so as to simultaneously maximize the avalanche current.

SUMMARY OF THE INVENTION

The solution idea underlying the present invention is that of realizing the epitaxial layer forming the drain region of the multi-drain device with a variable resistivity wherein the column regions in the epitaxial layer are realized with implant doses balancing the concentration of the epitaxial layer.

Advantageously, the resistivity of the epitaxial layer forming the drain region decreases upwards the device.

More specifically, an embodiment of the invention relates to a power electronic device integrated on a semiconductor substrate of a first type of conductivity comprising a plurality of elemental units. Each elemental unit comprises a body region of a second type of conductivity realized on a semiconductor substrate of the first type of conductivity formed on said semiconductor substrate, and a column region of the first type of conductivity realized in said semiconductor layer below said body region.

An embodiment of the invention also relates to a process for manufacturing an integrated power electronic device on a semiconductor substrate of a first type of conductivity comprising a plurality of elemental units. The process comprises the steps of: forming a first semiconductor layer of the first type of conductivity of a first resistivity value on said highly doped semiconductor substrate, and forming, for each elemental unit, a first sub region of a second type of conductivity by means of a first selective implant step with a first implant dose.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

With reference to the figures, a power electronic device of the multi-drain type integrated on a semiconductor substrate and relative manufacturing process are described.

The hereafter described process steps do not form a complete process flow for the manufacturing of integrated circuits. The present invention can be put into practice together with the manufacturing techniques of integrated circuits currently used in the field, and only those commonly used process steps which are necessary for the understanding of the present invention are included in the description.

The figures showing cross sections of an integrated electronic device portion during the manufacturing are not drawn to scale, by they are instead drawn so as to show the important characteristics of the structure.

Figure 5:
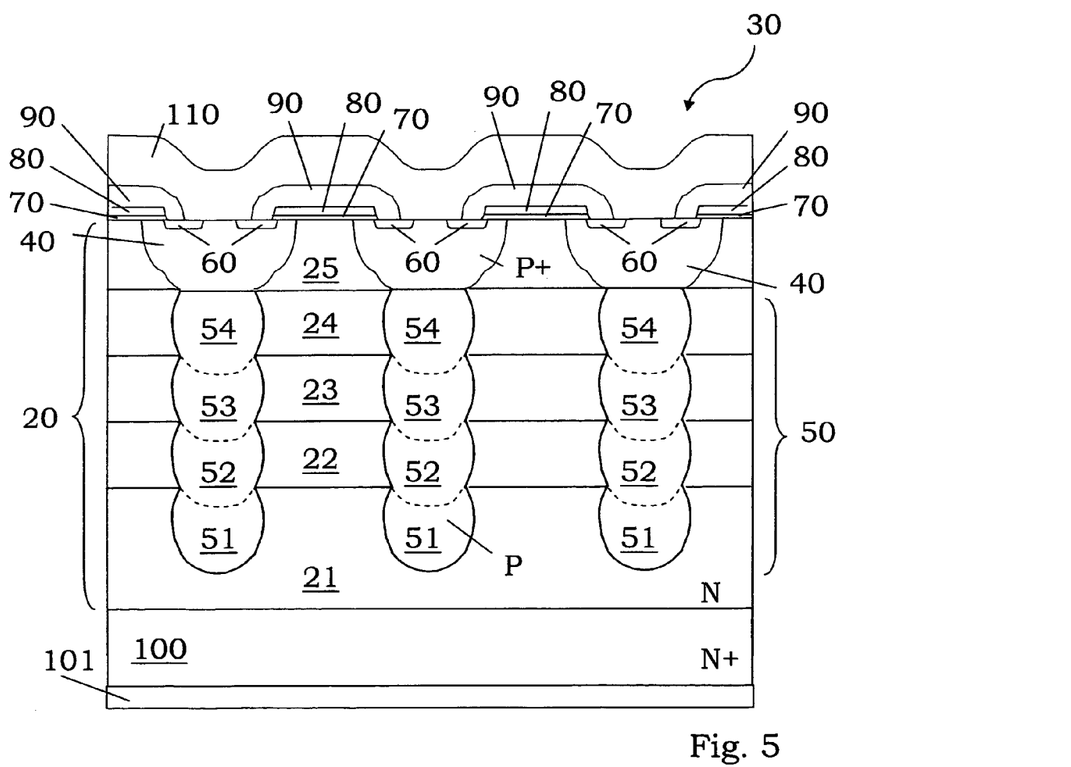
FIG. 5 is a sectional view of a multi-drain power device according to the present invention.
Figure 6:
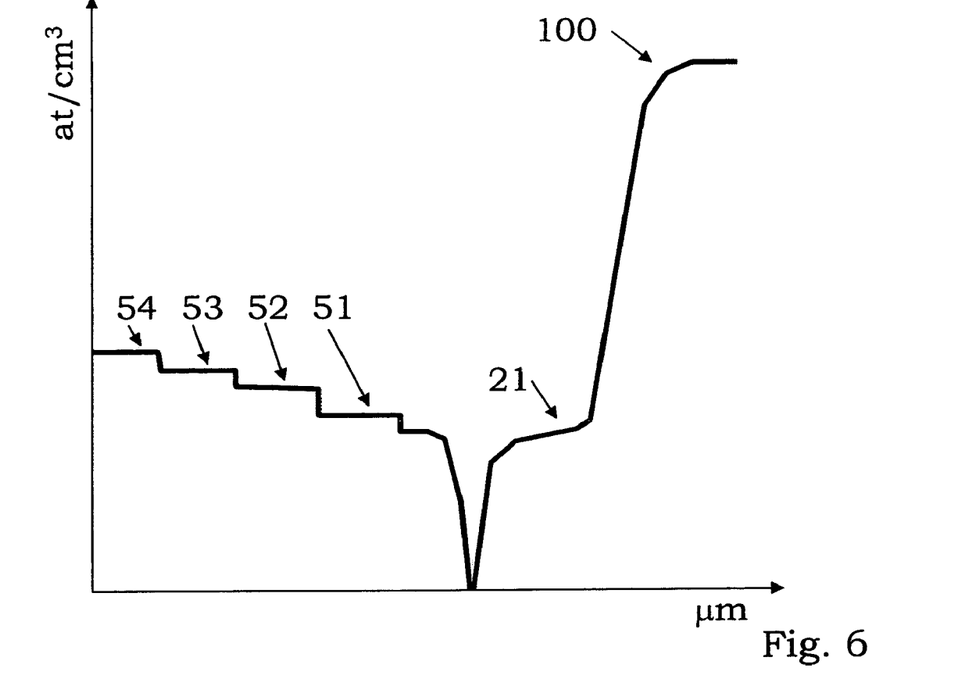
FIGS. 6 and 7 respectively show a concentration profile in the epitaxial layer of the N type and in the column P of the multi-drain power device of FIG. 5.
Figure 7:
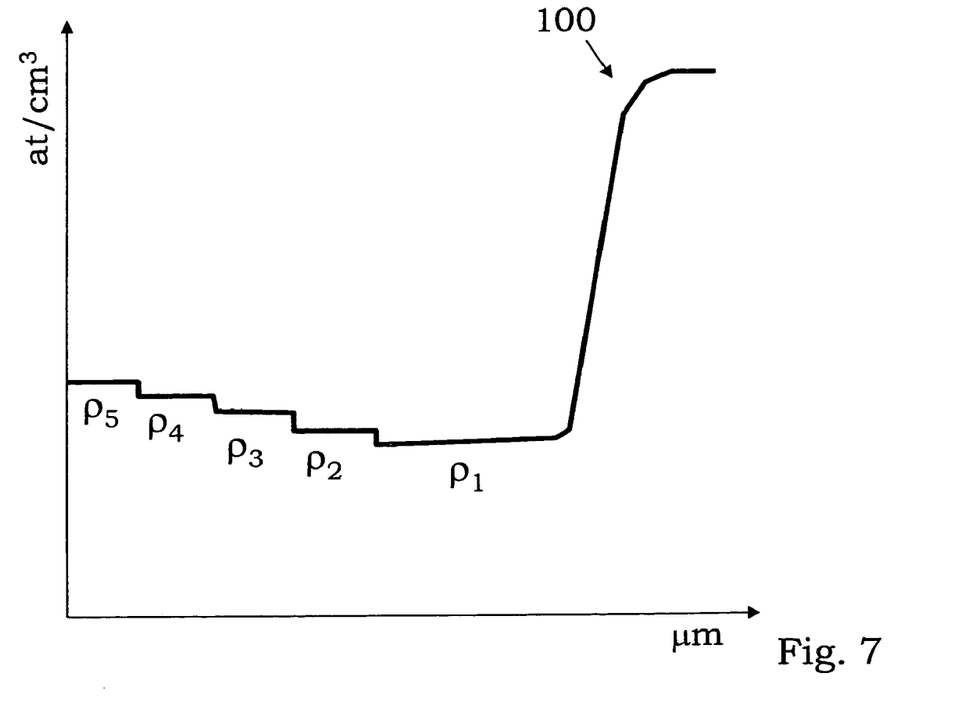

With reference to FIG. 5, for example a multi-drain MOS power device 30 is shown which comprises a highly doped semiconductor substrate 100, whereon a semiconductor layer 20 is formed realized by means of epitaxial growth of the same type. In the shown embodiment, reference is made to an N channel power MOS transistor, for which both the semiconductor substrate 100 and the semiconductor layer 20 are realized with conductivity of the N type. For devices with P channel, the semiconductor substrate 100 and the epitaxial semiconductor layer 20 are realized with conductivity of the P type.

According to the invention the epitaxial layer 20 comprises a plurality of overlapped epitaxial layers 21, 22, 23, 24 and 25. According to the invention the dopant concentration of each one of these overlapped epitaxial layers 21, 22, 23, 24 and 25 is different.

In an advantageous embodiment, the dopant concentration of these epitaxial layers 21, 22, 23, 24 and 25 increases upwards of the device 30 and as a consequence the resistivity of each layer decreases departing from the semiconductor substrate 1. In particular, said p1 is the resistivity of the first epitaxial layer 21 formed on the semiconductor substrate 1, said p2 is the resistivity of the second layer 22 formed on the first epitaxial layer 21, said p3 is the resistivity of the third epitaxial layer 23 formed on the second epitaxial layer 22, said p4 is the resistivity of the fourth epitaxial layer 24 formed on the third epitaxial layer 23 and said p5 is thus the resistivity of the epitaxial layer 23 formed on the fourth epitaxial layer 24, wherein p1>p2>p3>p4>p5.

The epitaxial layer 20 as a whole forms a common drain region for a plurality of elemental units forming the power MOS device 30. Each elemental unit comprises a P body region 40 realized on the latter epitaxial layer 25. Advantageously, the body region 40 has the same depth of the latter epitaxial layer 25.

In the epitaxial layer 20, below each body region 40, P column regions 50 are present extending downwards for the whole thickness of the epitaxial layer 20.

In particular, each column region 50 is aligned and in contact with a respective body region 40.

According to the invention, each column region 50 comprises a plurality of sub-regions 51, 52, 53 and 54 whose dopant concentration of each sub-region is different from those of the other sub-regions.

In particular, the first sub-region 51 is realized in the first epitaxial layer 21, the second sub-region 52 is realized in the second epitaxial layer 22, the third sub-region 53 is realized in the third epitaxial layer 23 and the fourth sub-region 54 is realized in the fourth epitaxial layer 24.

According to the invention, the implant steps with which the sub-regions 51, 52, 53 and 54 are realized are carried out with such a respective implant dose $\Phi_i$ as to balance the dopant concentration of the epitaxial layers 21, 22, 23 and 24 wherein they are realized. In particular, the introduced dopant in the regions 51, 52, 53 and 54 has to overcompensate for the dopant in the region 21, 22, 23 and 24 in order to form a P region (column 50) from N layer (drain layer 20) and this overcompensation is performed so that the number of dopant atoms of P type (that exceed the compensation) are equal to the number of dopant atoms of N type of the external region to the column 50. So, in the device according to the invention, the balance (included the overcompensation) is formed in each couple of P/N regions: 51/21, 52/22, 53/23, 54/24, and therefore the amount of charge of each doped sub-regions (51, 52, 53, 54) balances the amount of charge of the semiconductor layer (21, 22, 23, 24) wherein each doped sub-region (51, 52, 53, 54) is realized.

Advantageously, in the embodiment shown in the figures, the sub-region 51 realized in the first epitaxial layer 21 has the lowest dopant concentration among the regions forming the column region 50 since the resistivity p1 of the first epitaxial layer 21 is higher than that of the upper epitaxial layers and for this reason the value of the electric field on the bottom of the column regions 50 is remarkably reduced with respect to the devices of the prior art.

The power MOS device 30 has, in a conventional way, inside the body regions 4, highly doped source regions 60 of the N+ type.

The surface of the epitaxial layer 20 is thus covered with a thin gate oxide layer 70 and with a polysilicon layer 80. Openings are thus provided in the polysilicon layer 80 and in the thin gate oxide layer 70 to expose the surface of the epitaxial layer 20 in correspondence with each source region 60. An insulating layer 90 covers completely the polysilicon layer 80 and partially the source region 60, so as to allow a source metallic layer 110 to contact the source regions 60 and the body regions 40. A drain metallic layer 101 is also provided on the lower surface of the semiconductor substrate 100.

With reference to FIGS. 8 to 12, the method for realizing the multi-drain MOS device 30 according to the invention is now described.

Figure 8:
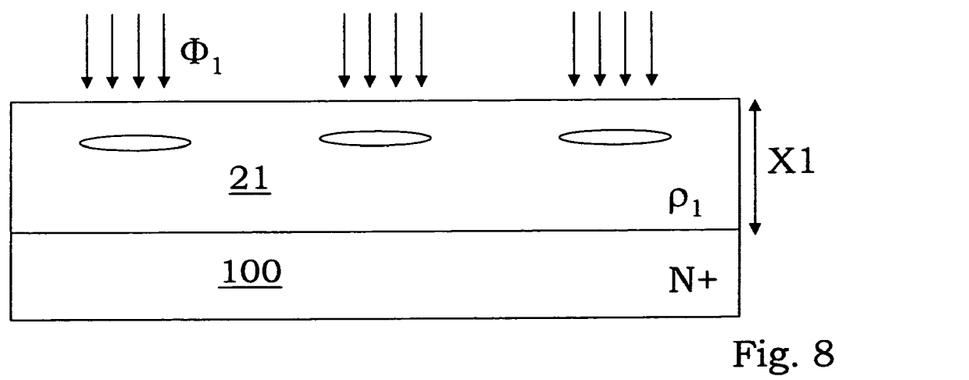
FIGS. 8 to 12 show some process steps for realizing the multi-drain power device of FIG. 5.

As shown in FIG. 8, on the N+ highly doped semiconductor substrate 100 the first epitaxial layer 21 of the N type is grown with a first dopant concentration corresponding to a resistivity equal to p1. Advantageously, the first dopant concentration is comprised between $5 \times 10^{14}$ and $5 \times 10^{16}$ at/cm$^3$, p1 is comprised between 0.15 and 9 ohm*cm and the thickness X1 of the first epitaxial layer 21 is comprised between 1 and 30 μm.

Advantageously, after having formed a first photolithographic mask on the first epitaxial layer 21, in this first epitaxial layer 21 a trench is carried out through the first photolithographic mask for realizing a level zero indicator not shown in the figures.

Once the first mask is removed, a second mask is formed wherein a plurality of openings are opened. Through these openings a first P dopant implant step is carried out for realizing, by means of a successive diffusion process, the first sub-region 51.

According to the invention, the first implant dose $\Phi 1$ is chosen so that the implanted P dopant concentration balances the N dopant concentration of the first epitaxial layer 21.

Figure 9:
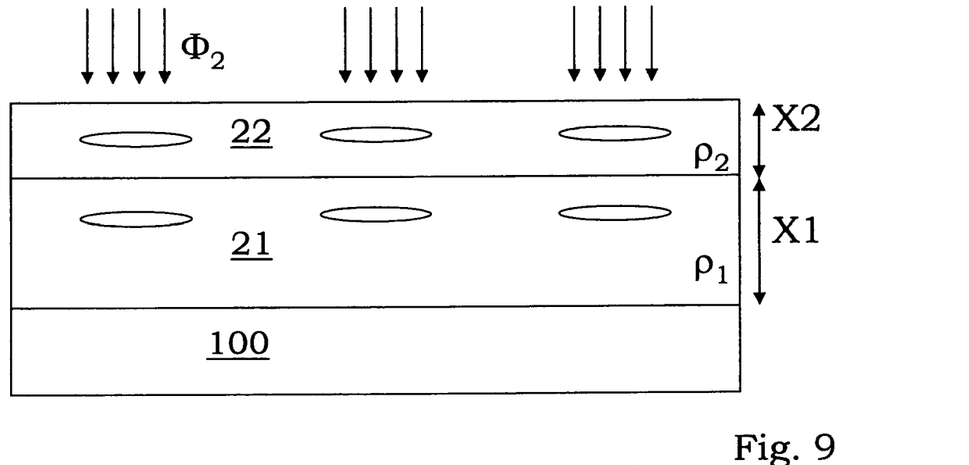

As shown in FIG. 9, the second epitaxial layer 22 of the N type is thus formed on the first epitaxial layer 21, it has a second dopant concentration corresponding to a resistivity p2 different with respect to that of the first epitaxial layer 21. Advantageously, the resistivity p2 is lower than that of the first epitaxial layer 21.

Advantageously, the second dopant concentration is comprised between $8 \times 10^{14}$ and $5 \times 10^{16}$ at/cm$^3$, p2 is comprised between 0.15 and 7 ohm*cm and the thickness X2 of the second epitaxial layer 22 is comprised between 1 and 8 μm.

Thus, a third mask is formed on the second epitaxial layer 22 wherein a plurality of openings are realized. Advantageously, such third mask is aligned with the previous ones by means of the level zero indicator. Through these openings a second P dopant implant step is thus carried out in the second epitaxial layer 22 for realizing by means of a successive diffusion process the second sub-region 52.

According to the invention, the second implant dose $\Phi 2$ is chosen so that the implanted dopant P concentration balances the dopant N concentration of the second epitaxial layer 22.

Advantageously, the second implant dose $\Phi 2$ is higher than the first implant dose $\Phi 1$.

Figure 10:
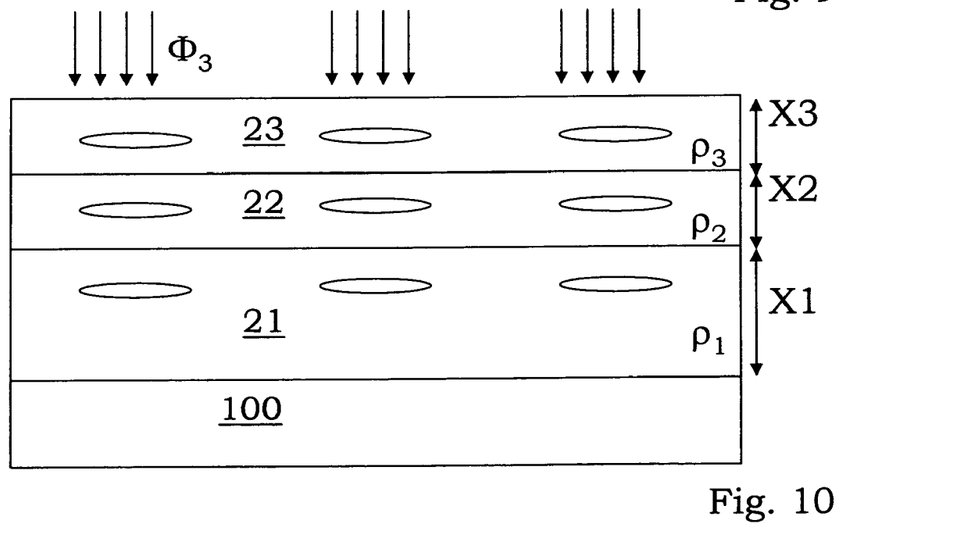

As shown in FIG. 10, on the second epitaxial layer 22, the third N epitaxial layer 23 is thus formed, it has a third dopant concentration corresponding to a resistivity p3 different with respect to that of the second epitaxial layer 22.

Advantageously, the resistivity p3 is lower than that of the second epitaxial 22 layer. Advantageously, the third dopant concentration is comprised between $8 \times 10^{14}$ and $5 \times 10^{16}$ at/cm$^3$, p3 is comprised between 0.15 and 7 ohm*cm and the thickness X3 of the third epitaxial layer 23 is comprised between 1 and 8 μm.

A fourth mask is then formed on the third epitaxial layer 23 wherein a plurality of openings are realized. Advantageously, such fourth mask is aligned with the previous ones by means of the level zero indicator. Through these openings a third dopant P implant step is thus carried out in the third epitaxial layer 23 for realizing by means of a successive diffusion process the third sub-region 53.

According to the invention, the third implant dose $\Phi 3$ is chosen so that the implanted dopant P concentration balances the N dopant concentration of the third epitaxial layer 23.

Advantageously, the third implant dose $\Phi 3$ is higher than the second implant dose 2.

Figure 11:
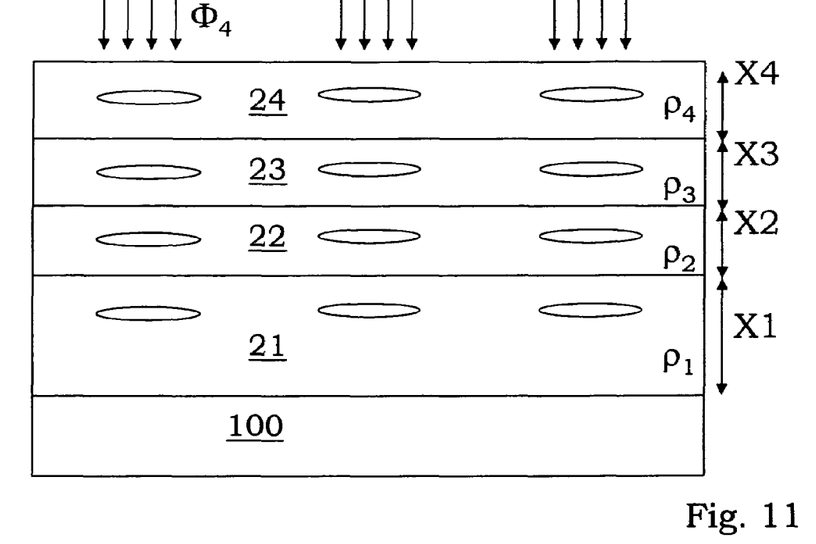

As shown in FIG. 11, on the third epitaxial layer 23, the fourth N epitaxial layer 24 is thus formed, it has a third dopant concentration corresponding to with a resistivity p4 different with respect to that of the third epitaxial layer 23.

Advantageously, the resistivity p4 is lower that that of the third epitaxial layer 23. Advantageously, the fourth dopant concentration is comprised between $8 \times 10^{14}$ and $5 \times 10^{16}$ at/cm$^3$, p4 is comprised between 0.15 and 7 ohm*cm and the thickness X4 of the fourth epitaxial layer 24 is comprised between 1 and 8 μm.

A fifth mask is then formed on the fifth epitaxial layer 24 wherein a plurality of openings are realized. Advantageously, such fifth mask is aligned with the previous ones by means of the zero level indicator. Through these openings a fourth dopant P implant step is then carried out in the fourth epitaxial layer 24 for realizing, by means of a successive diffuision process, the fourth sub-region 54.

According to the invention, the fourth implant dose $\Phi 4$ is chosen so that the implanted P dopant concentration balances the dopant N concentration of the fourth epitaxial layer 24.

Advantageously, the fourth implant dose $\Phi 4$ is higher than the third implant dose $\Phi 3$.

Figure 12:
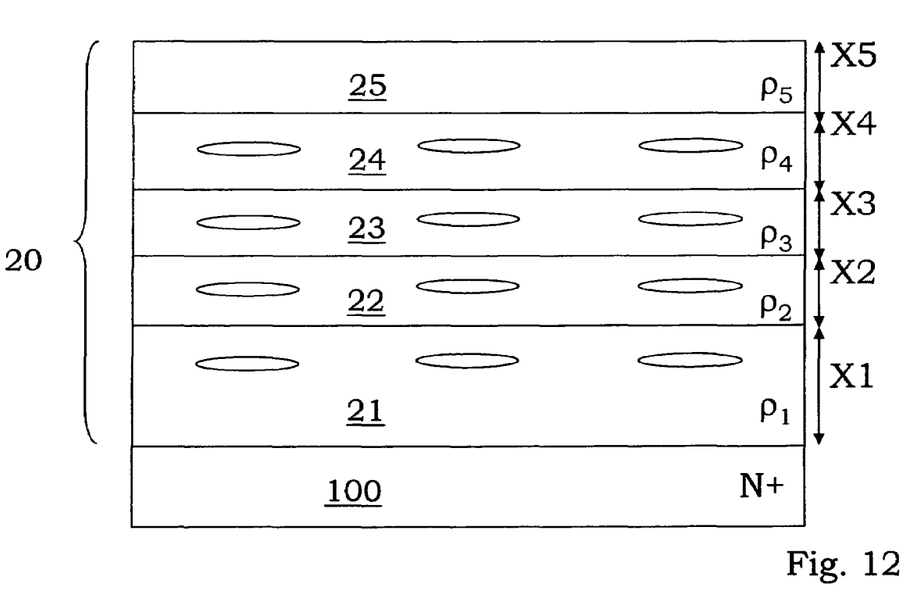

As shown in FIG. 12, as last on the fourth epitaxial layer 24, the fifth N epitaxial layer 25 is formed having a fifth dopant concentration corresponding to a resistivity p5 different with respect to the fourth epitaxial layer 24. Advantageously, the fifth resistivity p5 is lower than the fourth resistivity p4.

For example, the fifth dopant concentration is comprised between $8 \times 10^{14}$ and $5 \times 10^{16}$ at/cm$^3$, p5 is comprised between 0.15 and 7 ohm*cm and the thickness X5 of the fifth epitaxial layer 25 is comprised between 1 and 8 μm.

A sixth mask is then formed on the fifth epitaxial layer 25 wherein a plurality of openings are realized. Advantageously, such sixth mask is aligned with the previous ones by means of the level zero indicator. Through these openings a fifth N+ dopant implant step is then carried out in the fifth epitaxial layer 25 for realizing the body regions 40 of the device 30.

The diffusion process is then carried out for completing the sub-regions 51, 52, 53, 54 and the source regions of the device 30, and so that the sub-regions 51, 52, 53, 54 form a single column region 50 aligned and in contact with the body region 40.

After having formed the source regions 60 inside the respective body regions 40, the process is then completed with the conventional manufacturing steps which provide the formation of the thin gate oxide layer 70 and the polysilicon layer 80 on the surface of the epitaxial layer 20. Openings are thus provided in the polysilicon layer 80 and in the thin gate oxide layer 70 until the surface of the epitaxial layer 20 is exposed in correspondence with each source region 60. The insulating region 90 is formed until the polysilicon layer 80 is completely covered and the source region 60 is partially covered, so as to allow a source metallic layer 110 formed on the device 30 to contact the source regions 60 and the body regions 40. A drain metallic layer 101 is finally formed on the lower surface of the semiconductor substrate 100.

In the description specific reference has been made to a drain epitaxial region 50 made of five epitaxial layers. However, the number of layers which must be formed can be different. Such number of epitaxial layers in fact depends on the breakdown voltage BV the final device 30 must sustain.

In summary, the device according to the invention allows to maximize the breakdown voltage BV since in the column regions 50 a charge balance is always realized. Advantageously, the avalanche current Iuis is maximized by reducing the electric field value on the bottom of the column regions 50, realizing the first epitaxial layer 21 with concentration value lower than known MOS devices.

Although all the description has been referred to a multi-drain MOS device, the same considerations can be reported for all those devices, called a superjunction, wherein column regions are provided below the body regions.

Although preferred embodiments of the device of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A power electronic device of the multi-drain type integrated on a semiconductor substrate of a first type of conductivity comprising a plurality of elemental units, each elemental unit comprising:
   a body region of a second type of conductivity realized on a first semiconductor layer of the first type of conductivity formed on said semiconductor substrate,
   a column region of the second type of conductivity realized in an underlying second semiconductor layer below said body region,
   wherein said second semiconductor layer comprises at least three sub-semiconductor layers, overlapped on each other, wherein the resistivity of each sub-semiconductor layer is different from that of the other sub-semiconductor layers and said resistivity decreases in each sub-semiconductor layer upwards towards the first semiconductor layer, and
   wherein said column region comprises at least three doped sub-regions, each one realized in one of said sub-semiconductor layers, wherein the amount of charge of each doped sub-region balances the amount of charge of the sub-semiconductor layer in which each doped sub-region is realized and doping concentration increases in each doped sub-region upwards towards the first semiconductor layer.

2. The power electronic device according to claim 1, wherein said first semiconductor layer has a resistivity lower than the underlying sub-semiconductor layers in which said column region is realized.

3. The power electronic device according to claim 1, wherein said sub-semiconductor layers have a much lower concentration value than said semiconductor substrate.

4. The power electronic device according to claim 1, wherein said semiconductor layers are epitaxial layers.

5. The power electronic device according to claim 1, wherein said device is a MOS transistor.

6. A power electronic device integrated on a semiconductor substrate of a first type of conductivity comprising a plurality of elemental units, each elemental unit comprising:
   a body region of a second type of conductivity realized on a first semiconductor layer of the first type of conductivity formed on said semiconductor substrate,
   a column region of the second type of conductivity realized in a second semiconductor layer below said body region,
   wherein said second semiconductor layer comprises a plurality of sub-semiconductor layers, overlapped on each other,
   wherein the resistivity of each sub-semiconductor layer is different from that of the other sub-semiconductor layers,
   wherein said column region comprises a plurality of doped sub-regions, each one realized in one of said sub-semiconductor layers, and
   wherein the amount of charge of each doped sub-region balances the amount of charge of the sub-semiconductor layer in which each doped sub-region is realized, the dopant concentration of the sub-region increasing upwards towards the first semiconductor layer where the body region is formed.

7. The power electronic device according to claim 6, wherein the resistivity of the overlapped sub-semiconductor layers decreases upwards towards the upper surface of said device where the body region is formed.

8. The power electronic device according to claim 7, wherein said first semiconductor layer has a resistivity lower than the underlying sub-semiconductor layers.

9. The power electronic device according to claim 6, wherein said semiconductor layers have a much lower concentration value than said semiconductor substrate.

10. The power electronic device according to claim 6, wherein said semiconductor layers are epitaxial layers.

11. The power electronic device according to claim 6, wherein said device is a MOS transistor.

* * * * *

UNITED STATES PATENT AND TRADEMARK OFFICE
CERTIFICATE OF CORRECTION

| | | |
|---|---|---|
| PATENT NO. | : 7,498,619 B2 | Page 1 of 1 |
| APPLICATION NO. | : 11/362435 | |
| DATED | : March 3, 2009 | |
| INVENTOR(S) | : Mario Guiseppe Saggio et al. | |

It is certified that error appears in the above-identified patent and that said Letters Patent is hereby corrected as shown below:

At column 6, line number 50, please remove the word [diffuision] and replace with the word -- diffusion --.

Signed and Sealed this
Twenty-first Day of June, 2011

David J. Kappos
*Director of the United States Patent and Trademark Office*